Sept. 24, 1963 G. M. RICHARD ETAL 3,105,213

SEALED VARIABLE IMPEDANCE DEVICE

Filed Sept. 8, 1961 2 Sheets-Sheet 1

INVENTOR.
GRANT M. RICHARD
KENNETH L. RICHARD

BY

Beau, Brooks, Buckley & Beau

ATTORNEYS

INVENTOR.
GRANT M. RICHARD
KENNETH L. RICHARD
BY
Bean, Brooks, Buckley & Bean
ATTORNEYS United States Patent Office 3,105,213

Patented Sept. 24, 1963

3,105,213

SEALED VARIABLE IMPEDANCE DEVICE

Grant M. Richard and Kenneth L. Richard, East Aurora, N.Y., assignors to Delavan Electronics Corp., East Aurora, N.Y.

Filed Sept. 8, 1961, Ser. No. 136,847
9 Claims. (Cl. 336—136)

This invention relates to electronic components in general and pertains more particularly to certain structural improvements in electronic components having variable characteristics.

Presently, considerable emphasis is placed upon miniaturization of electronic equipment and, in general, it is desirable to accomplish this end without sacrifice in quality, reliability, etc. while at the same time maintaining the cost of the equipment at a practical minimum. The steadily increasing volume of miniaturized equipment available to the consumer is testimony to the success which has been achieved in this direction. However, there is constantly room for improvement not only in further reduction in size and space requirement, but also in such factors as reliability and quality. The present invention has these objectives in view in conjunction with electronic components used for tuning, trimming, aligning, and the like and, more specifically, in conjunction with such components as tuning coils and transformers, variable capacitors and resistors, and the like.

The above primary objectives of the present invention are achieved generally by using a movable tuning or the like member which is housed completely within the electronic device and wherein the means for moving such member is accessible from outside the component but does not contribute in any material degree to the space requirement for the component either by virtue of its existence per se or by virtue of any repositioning or movement thereof incidental to movement of the tuning member.

More specifically, it is an object of this invention to provide the combination of an electronic component housing containing an internally threaded sleeve within which a rotatable tuning or the like member is received and a key element cooperative with the tuning element to effect rotary movement and consequent translatory adjustment thereof.

Ancillary to the above, it is an object of this invention to effect tuning and the like adjustment as above to achieve miniaturization and, as well, to obtain predetermined resistance or drag so that tuning adjustments will be both positive and exact as well as relatively free from vibration or similarly induced disturbance. To these ends the present invention embodies an internally threaded sleeve containing a traveling screw thread member whose movement is effective to produce the variable effect of the associated electronic component, wherein the traveling member is fully engaged with the sleeve throughout its range of adjustment.

The above object is enhanced by the association of a rotatable key member cooperable with the traveling member which is, in itself, so mounted as to produce a predetermined drag or resistance to adjustment of the traveling member and wherein the bushing for the key serves certain ancillary objectives of the present invention.

In conformity with the preceding object, this invention envisages the combination, in a tunable electronic component, of a cup-like housing having an end wall receiving a bushing, which bushing journals and axially locates a tuning key and simultaneously locates the end of the traveling member sleeve thereadjacent.

More specifically, one form of the present invention envisages in the combination, in a transformer or like assembly, of a cup-like housing having an end wall opening which is of but slightly smaller diameter than the traveling member-receiving sleeve disposed in such housing in end abutting relation to the interior surface of such end wall, and a bushing which projects into and thus aligns the sleeve while receiving, in a shallow groove therein, the narrow annulus defined between the interior of the sleeve and the edge of the end wall opening.

A further object of this invention is to provide an assembly according to the preceding object wherein the bushing receives the journal portion of a traveling member key radially inwardly of the annulus so that the presence of the key serves to maintain the snap-fit between the bushing and the end wall.

Still another object of this invention is to provide an assembly as aforesaid in which a mutually retentive bushing-key assembly is employed for the purpose of simplifying both manufacture and assembly of such variable electronic components as tunable R.F., I.F. and V.H.F. transformers, without in any way detracting from the quality or proficiency thereof and while achieving the ends of miniaturization and ease and accuracy of adjustment.

Other objects and advanatges of the invention will appear from the description hereinbelow and the accompanying drawings wherein.

Figure 1:
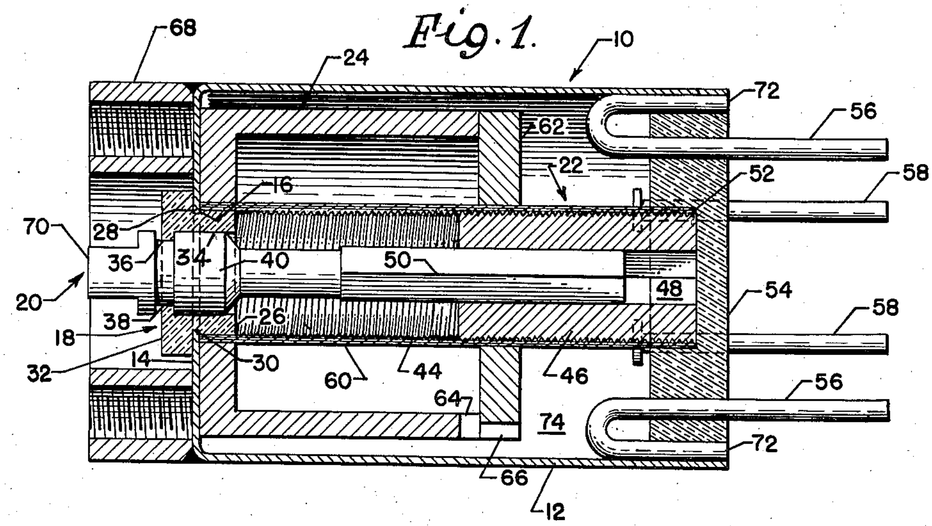
FIG. 1 is a longitudinal section taken through a transformer assembly constructed in accordance with this invention.
Figure 2:
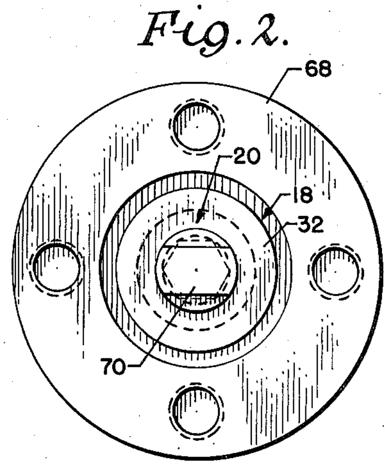
FIG. 2 is an end view of the assembly shown in FIG. 1.

Referring to FIG. 1, the transformer assembly specifically shown therein includes a housing 10 preferably having a cylindrical side wall 12 and provided with a wall 14 at one end. The housing, then, is cup shaped and it is to be noted that the end wall 14 is provided with an opening 16, preferably centrally thereof.

An essential feature of this invention is the bushing 18 which is fixedly located within the opening 16 of the end wall 14, the bushing serving the purpose of journalling the key 20 and also of aligning one end of sleeve 22 and the coil form cup 24. At the same time, the bushing permits of easy assembly, as will be pointed out more particularly hereinafter, and, in conjunction and combination with the sleeve and other elements as hereinafter defined, the bushing is effective to achieve a nicety of adjustment heretofore unobtainable as well as an adjusting assemblage which is relatively free from unintentional variation or change due to vibration and the like.

For these purposes, the bushing 18 is formed of deformable material having suitable bearing properties and, to this end, it is preferred that the bushing be made of Teflon. One end 26 of the bushing snugly fits within the corresponding end of the sleeve 22 and it is to be noted that the opening 16 is only slightly smaller than the inside of the sleeve so as to expose only a narrow annulus 28 of the end wall 14 within the opening of the sleeve 22.

The bushing is provided with a shallow groove or undercut 30 receiving the annulus 28 and it is understood that the annulus 28 is of such dimension as to permit the bushing 18 to be snapped into engagement therewith while at the same time assuring a reasonable amount of axial restraint on the bushing so as to prevent its accidental withdrawal. In this regard, as will be treated in more detail later, the bushing will not ordinarily be subjected to such forces as would tend to displace the annulus 28 from the groove 30.

The bushing 18 is further provided with an enlarged flange portion 32 opposite the end 26, such flange being of larger diameter than the end 26 and being adapted to bear in face-to-face contact with the outer surface of the end wall 14. The bushing is also provided with an enlarged bore 34 and a smaller bore 36, the latter of which is defined by an inwardly directed annular retaining lip 38. The enlarged bore 34 serves to act as a bearing for the journal portion 40 of the key 20 while the retaining lip 38 serves to axially restrain the key by virtue of its disposition within the groove 42 in the key portion 40.

The tube 22 is preferably constructed of glass fibre reinforced polyester material and is provided with internal threads 44 receiving the externally threaded tuning slug 46. The tuning slug is provided with a non-circular axial bore 48 which receives the correspondingly non-circular drive portion 50 of the key. Thus, rotation of the key will effect rotation and consequent axial displacement of the tuning slug 46. At the same time, the slug will simply slide on the drive portion 50 of the key so that only negligible friction-induced axial displacement will be imparted to the key. It is this relationship that permits the relatively small end wall annulus 28 to effectively hold the bushing 18 in proper position even though the retention effect of such annulus may not be of appreciable magnitude. This, in turn, assures an easy snap-fit engagement between the end wall 14 and the bushing 18.

The end of the sleeve 22 remote from the end wall 14 is maintained in alignment by its reception in the recess 52 of an insulating terminal base 54. Preferably, this insulating base is made of phenolic material and is provided with a plurality of terminal prongs such as the ground terminals 56 and coil terminals 58. Four such terminals 58 would normally be provided for an I.F. transformer, for example, with the two ground terminals 56 as shown.

Although the coil or coils, as the case may be, are not shown in the drawing, it is to be understood that the cup-like coil form 24 houses the same in surrounding relation to the portion 60 of the sleeve 22 therewithin. A disc 62 serves to complete the coil form enclosure and it is to be understood that suitable means such as the matching groves 64 and 66 are provided for the leads of the coil or transformer for connection to the various terminals 58.

In addition to the above, the assembly may be provided with a mounting collar 68, substantially as shown. In this way, the component may be either used in a printed circuit, in which case the prongs would be received in the circuit board, or in a conventional wired circuit, in which case the component would be mounted by its collar 68, with the prongs serving as soldering terminals. Preferably, the head 70 of the key is substantially wholly confined within the collar 68 when such is used, it being appreciated that this head may be of any desired form which is readily usable with conventional tool means.

The combination of elements as set forth above lends itself very readily to easy assembly while at the same time is effective to produce an assembly of high quality. In assembling the device, the housing 10 with base 68 attached, is snap-fitted to the bushing 18 and the key 20 is then snap-fitted within the bushing. Thereafter, the subassembly comprising the sleeve 22, core 24 and associated coil or coils together with plate 69 and slug 46 are engaged. The terminal base assembly with coil leads connected also preferably forms part of this subassembly, thus completing the requisite components. The ends 72 of the ground terminals 56 are soldered to the housing 74 to fix the base in position and the space surrounding the sleeve 22 and core 24 is preferably filled with epoxy material. The thus completed assembly is capable of full range tuning between the extreme right hand position of slug 46 as shown and the extreme left hand position thereof in which it is engaged against the inner face of the bushing 18. It is to be noted that the axially staggered relation of the bushing groove 30 and retaining lip 38 permit of the sequential snap-fitting as specified. That is, with the key disengaged, no difficulty is experienced in snap-fitting the bushing to the housing, and once the bushing is snap-fitted to the housing, the location of the retaining lip 38 offers no difficulty in engagement with the key. By the same token, once the key is engaged in the bushing, it is virtually impossible to displace the bushing from the housing.

Whereas the preceding description concerns itself mainly with the functional aspects of assembly, it is to be understood that equally, if not more, important are the considerations of miniaturization and nicety of control. To appreciate these functions, it will be seen that in the combination of elements as described, the key 20 does not, throughout the range of adjustment of the traveling member or slug 46, project or extend from the housing by an amount greater than that shown. Thus, adjustment does not require variation in space requirement throughout the adjusting range.

Further, it is to be noted that the threads of the member 46 are fully engaged and preferably dimensioned to snugly engage the sleeve at all points within its adjustment range so as to provide a torque resistance to rotation which is substantially constant throughout the adjustment range, and that, additionally, there is a constant drag against rotation of the key 20 by virtue of the snug engagement of the bushing 18 thereon. Thus, regardless of the position to which the traveling member 46 has been adjusted, a constant, predetermined resistance to adjustment change is provided. This, in turn, permits of precise adjustment control characterized by the practical obviation of accidental or unwanted change due to vibration or the like. Still further, the snug engagement between the bushing 18 and the key 20 effectively provides a moisture barrier thereat. This effect, as well as enhancement of the constant drag characteristic, may be abetted by the presence of a quantity of lubricant such as silicone grease within the sleeve 22.

Figure 3:
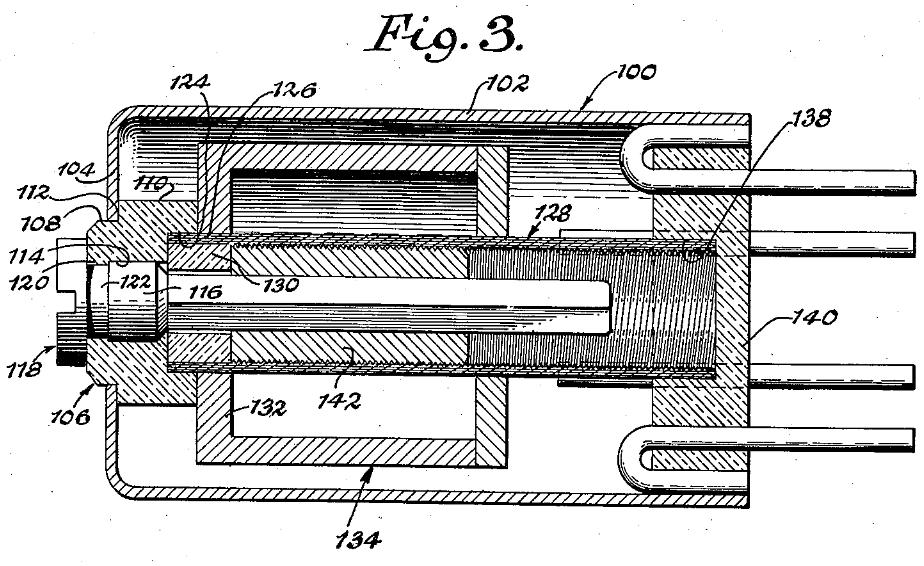
FIG. 3 is a section similar to FIG. 1 but showing a modified form of the invention.

With reference now to FIG. 3, the above beneficial objects and results are also achieved by the modification shown therein. As illustrated, the tunable electronic component includes a housing 100 having a tubular side wall 102 and provided with the end wall 104 to receive the bushing member 106. For this purpose, the bushing is provided with a portion 108 of reduced size whose juncture with the enlarged main body portion 110 provides an abutment face 112 bearing against the inner surface of the end wall 104.

The bushing is also provided with a bore 114 snugly receiving the journal 116 of the key member 118 as well as a retaining lip 120 received in the annular groove 122 of the key. Further, the bushing is provided with a counterbore 124 which receives and locates the corresponding end 126 of the sleeve 128. To secure good location of this end of the sleeve, the same may be internally reinforced by means of a rigidifying collar 130 of such axial length as to extend also within the confines of the end wall 132 of the form or component enclosure 134. The opposite end 136 of the sleeve is suitably located within a blind bore 138 of the insulating base or end member 140. The assembly is otherwise similar to the configuration previously described.

From the specific embodiments shown and as above described, it will be manifest that the objectives of this invention are accommodated in each case. The traveling member or turning slug 142 in FIG. 3 is capable of adjustment in the same general fashion as is the traveling member 46, with all the attendant advantages above described accruing thereto. In each case, also, deformable snap-fitted engagement between bushings and key serves to provide an easy means of assembling while the combination as a whole effects the miniaturization capability and attendant nicety of control, moisture-proofing and other advantages specifically mentioned. Preferably, bushing 110 is externally shaped in that portion thereof disposed within the housing 100 so as to become keyed against rotation relative to the housing after the "potting" material is set therein. For example, the bushing may be of any polygonal form or may be merely provided with a suitable protrusion.

It is to be understood that certain changes and modifications as illustrated and described may be made without departing from the spirit of the invention or the scope of the following claims.

We claim:

1. In a miniaturized, tunable electronic component, the combination of a housing having a tubular side wall and opposite end wall closure members defining a cylindrical hollow enclosure for receiving tunable electronic means, a bushing projecting through one of said end wall members, an internally threaded sleeve extending between said end wall members and located at its end adjacent said one wall member by said bushing, an externally threaded traveling member received and engaged in said sleeve, a key journalled within said bushing and having a non-circular drive portion projecting axially of said sleeve, said traveling member having a non-circular bore receiving said drive portion of the key, said traveling member being of materially less length than said sleeve whereby full-thread engagement is had between traveling member and sleeve throughout the adjustment range of the former, and there being a deformable lip-groove interengagement between said bushing and said key for axial restraint of the latter.

2. In a tunable electronic component, a housing member having an end wall provided with an opening, a sleeve within said housing adapted to receive tunable electronic means in surrounding relation thereto, said sleeve being internally threaded, a traveling member threadedly engaged in said sleeve and having a non-circular axial bore therein, a key member having a journal portion and having a non-circular drive portion engaged in said bore of the traveling member, and means for locating said sleeve within said housing comprising a bushing received in said opening in the end wall, said bushing and said key being interengaged to axially locate the later, and said key being snugly journalled within said bushing to effect predetermined resistance to rotation thereof.

3. In a tuned transformer or the like, a housing having a tubular side wall and provided with an end wall at one end with the other end being open, a closure member fixed to said housing and closing said other end thereof, said end wall having an opening and said closure member having a recess aligned therewith, an elongate sleeve in said housing having one end received in said recess of the closure member, said sleeve being internally threaded, a tuning slug threadedly engaged in said sleeve, a bushing received in said opening in the end wall and projecting inwardly thereof into locating engagement with said sleeve, and a key journalled in said bushing and extending inwardly of said sleeve into driving engagement with said slug.

4. In a tunable electronic component, a housing member having an end wall provided with an opening, a sleeve fixed within said housing in alignment with said opening and adapted to receive tunable electronic means in surrounding relation thereto, said sleeve being internally threaded, a traveling member threadedly engaged in said sleeve and having a non-circular axial bore therein, a key member having a head portion disposed externally of said housing and a non-circular drive portion engaged in said bore of the traveling member, and a bushing for said key, said bushing being snap-fitted in said end wall opening and extending on either side of said end wall said key being snap-fitted in said bushing and having a journal portion snugly engaged with the interior of said bushing and extending one either side of said end wall to retain the snap-fitted engagement between said bushing and said end wall.

5. In a tuned transformer or the like, a housing having a tubular side wall and provided with an end wall at one end with the other end being open, a base fixed to said housing and closing said other end thereof, said end wall having an opening and said base having a recess aligned therewith, an elongate sleeve in said housing having one end received in said recess of the terminal base and its other end abutting said end wall, said sleeve being internally threaded, a tuning slug threadedly engaged in said sleeve, a bushing received in said opening in the end wall and projecting inwardly thereof snugly within said sleeve, and a key journaled in said bushing and extending inwardly of said sleeve into driving engagement with said slug.

6. In a tuned transformer or the like, a housing having a tubular side wall and provided with an end wall at one end with the other end being open, a base fixed to said housing and closing said other end thereof, said end wall having an opening and said base having a recess aligned therewith, an elongate sleeve in said housing having one end received in said recess of the base and its other end abutting said end wall, said sleeve being internally threaded, a tuning slug threadedly engaged in said sleeve, a bushing received in said opening in the end wall and projecting inwardly thereof snugly within said sleeve, and a key journalled in said bushing and extending inwardly of said sleeve into driving engagement with said slug, said sleeve being of internal diameter just slightly greater than the diameter of said end wall opening defining a narrow end wall annulus inwardly of the sleeve, said bushing having a shallow groove receiving said annulus, said key having a journal portion received in said bushing extending on opposite sides of said end wall to thereby retain said annulus within said groove.

7. In a tuned inductance coil assembly, a cup-like housing member having an end wall provided with an opening, a sleeve fixed within said housing in alignment with said opening and adapted to receive coil means in surrounding relation thereto, said sleeve being internally threaded, a tuning slug threadedly engaged in said sleeve and having a non-circular axial bore therein, a key member having a head portion disposed externally of said housing and a non-circular drive portion engaged in said bore of the tuning slug, and a bushing for said key, said bushing being snap-fitted in said end wall opening and said key being snap-fitted in said bushing, said sleeve being of internal diameter just slightly greater than the diameter of said end wall opening defining a narrow end wall annulus inwardly of the sleeve, said bushing having a shallow groove receiving said annulus, said key having a journal portion received in said bushing extending inwardly of said end walls to thereby retain said annulus within said groove.

8. In a tuned transformer or the like, a housing having a tubular side wall and provided with an end wall at one end with the other end being open, a terminal base fixed to said housing and closing said other end thereof, said end wall having an opening and said terminal base having a recess aligned therewith, an elongate sleeve in said housing having one end received in said recess of the terminal base and its other end abutting said end wall, said sleeve being internally threaded, a tuning slug threadedly engaged in said sleeve, a bushing received in said opening in the end wall and projecting inwardly thereof snugly within said sleeve, and a key journalled in said bushing and extending inwardly of said sleeve into driving engagement with said slug, said sleeve being of internal diameter just slightly greater than the diameter of said end wall opening defining a narrow end wall annulus inwardly of the sleeve, said bushing having a shallow groove receiving said annulus, said key having a journal portion received in said bushing extending inwardly of said end wall to thereby retain said annulus within said groove, said journal portion of the key having a groove therein disposed outwardly of said end wall, and said bushing having a deformable radially inwardly directed retaining lip received in the groove of said journal portion.

9. In a tuned transformer or the like, a housing having a tubular side wall and provided with an end wall at one end with the other end being open, a terminal base fixed to said housing and closing said other end thereof, said end wall having an opening and said terminal base having a recess aligned therewith, an elongate sleeve in said housing having one end received in said recess of the terminal base, said sleeve being internally threaded, a tuning slug threadedly engaged in said sleeve, a bushing received in said opening in the end wall and projecting inwardly thereof into embracing relation with said sleeve, and a key journalled in said bushing and extending inwardly of said sleeve into driving engagement with said slug, said key having a journal portion received in said bushing and said journal portion of the key having a groove therein, and said bushing having a deformable radially inwardly directed retaining lip received in the groove of said journal portion.

References Cited in the file of this patent

UNITED STATES PATENTS

| | | |
|---|---|---|
| 2,728,235 | Mifflin | Dec. 27, 1955 |
| 2,820,954 | Fay | Jan. 21, 1958 |
| 2,836,805 | Goldsmith | May 27, 1958 |
| 2,875,419 | Lear | Feb. 24, 1959 |
| 2,941,172 | Sutton | June 14, 1960 |
| 3,027,527 | West | Mar. 27, 1962 |